(12) United States Patent
Koroglu et al.

(10) Patent No.: US 9,479,199 B2
(45) Date of Patent: Oct. 25, 2016

(54) LOW-COST RECEIVER USING INTEGRATED INDUCTORS

(71) Applicant: Silicon Laboratories Inc., Austin, TX (US)

(72) Inventors: Mustafa H. Koroglu, Austin, TX (US); Yu Su, Austin, TX (US)

(73) Assignee: SILICON LABORATORIES, INC., Austin, TX (US)

( * ) Notice: Subject to any disclaimer, the term of this patent is extended or adjusted under 35 U.S.C. 154(b) by 0 days.

(21) Appl. No.: 14/930,139

(22) Filed: Nov. 2, 2015

(65) Prior Publication Data

US 2016/0056845 A1 Feb. 25, 2016

Related U.S. Application Data

(60) Division of application No. 14/612,232, filed on Feb. 2, 2015, now Pat. No. 9,209,838, which is a division of application No. 13/468,824, filed on May 10, 2012, now Pat. No. 8,983,417, which is a continuation-in-part of application No. 13/342,548, filed on Jan. 3, 2012, now Pat. No. 8,725,103.

(51) Int. Cl.
*H04B 1/18* (2006.01)
*H04B 1/00* (2006.01)
(Continued)

(52) U.S. Cl.
CPC .............. *H04B 1/005* (2013.01); *H03F 1/565* (2013.01); *H03F 3/19* (2013.01); *H03F 3/193* (2013.01); *H03H 7/0169* (2013.01); *H03H 7/46* (2013.01); *H03H 11/1291* (2013.01); *H03J 3/10* (2013.01); *H04B 1/16* (2013.01); *H04B 1/1638* (2013.01); *H04B 1/18* (2013.01); *H03F 2200/171* (2013.01); *H03F 2200/294* (2013.01); *H03F 2200/451* (2013.01); *H03H 7/09* (2013.01); *H03H 2210/025* (2013.01); *H03H 2210/033* (2013.01); *H03J 2200/32* (2013.01)

(58) Field of Classification Search
None
See application file for complete search history.

(56) References Cited

U.S. PATENT DOCUMENTS 2,080,560 A 5/1937 Case
4,316,108 A 2/1982 Rogers, Jr.
(Continued)

OTHER PUBLICATIONS

"Applications of Switched-Capacitor Circuits in Active Filters and Instrumentation Amplifiers," Dr. William R. Grisé, Department of IET, Morehead State University, Technology Interface, vol. 3 No. 3, Fall 1999, ISSN# 1523-9926.
(Continued)

*Primary Examiner* — Lana N Le
(74) *Attorney, Agent, or Firm* — Polansky & Associates, P.L.L.C; Paul J. Polansky

(57) ABSTRACT

A receiver includes a first amplifier having an input for receiving a radio frequency (RF) signal, and an output for providing an amplified RF signal, a switch section for selectively switching the RF signal onto one of a plurality of nodes, and a filter section comprising a plurality of filters coupled to respective ones of the plurality of nodes. A first filter of the plurality of filters comprises a first variable capacitor coupled in parallel with an inductance leg between a corresponding one of the plurality of nodes and a power supply voltage terminal, wherein the first variable capacitor has a capacitance that varies in response to a tuning signal, and the inductance leg comprises a first inductor in series with an effective resistance, wherein the effective resistance has a value related to an upper cutoff frequency to be tuned by the first filter.

20 Claims, 7 Drawing Sheets

(51) Int. Cl.
| | |
|---|---|
| *H03J 3/10* | (2006.01) |
| *H04B 1/16* | (2006.01) |
| *H03H 7/01* | (2006.01) |
| *H03H 7/46* | (2006.01) |
| *H03H 11/12* | (2006.01) |
| *H03F 3/19* | (2006.01) |
| *H03F 1/56* | (2006.01) |
| *H03F 3/193* | (2006.01) |
| *H03H 7/09* | (2006.01) |

(56) References Cited

U.S. PATENT DOCUMENTS

| | | | |
|---|---|---|---|
| 4,361,909 A | 11/1982 | Theriault | |
| 4,364,116 A | 12/1982 | Nossek | |
| 4,368,541 A | 1/1983 | Evans | |
| 4,408,348 A | 10/1983 | Theriault | |
| 4,662,001 A | 4/1987 | Cruz | |
| 5,577,235 A | 11/1996 | Mitra | |
| 5,646,935 A | 7/1997 | Ishikawa et al. | |
| 5,737,035 A | 4/1998 | Rotzoll | |
| 6,097,273 A | 8/2000 | Frye | |
| 6,177,964 B1 | 1/2001 | Birleson et al. | |
| 6,266,522 B1 | 7/2001 | Holden | |
| 6,307,442 B1 * | 10/2001 | Meyer | H03H 7/06 333/17.1 |
| 6,377,315 B1 | 4/2002 | Carr et al. | |
| 6,377,788 B1 | 4/2002 | Elder | |
| 6,453,157 B1 | 9/2002 | Roberts | |
| 6,535,722 B1 | 3/2003 | Rosen | |
| 6,549,096 B2 | 4/2003 | Groves et al. | |
| 6,681,102 B1 | 1/2004 | Collier | |
| 6,778,117 B1 | 8/2004 | Johnson | |
| 6,813,485 B2 | 11/2004 | Sorrells et al. | |
| 6,915,114 B2 | 7/2005 | Khorram | |
| 6,917,328 B2 | 7/2005 | Rabinowitz et al. | |
| 7,039,385 B1 | 5/2006 | Hoffman | |
| 7,075,585 B2 | 7/2006 | Favrat et al. | |
| 7,095,454 B2 | 8/2006 | Waight | |
| 7,158,774 B2 | 1/2007 | Helio | |
| 7,231,192 B2 | 6/2007 | Suzuki | |
| 7,250,835 B2 * | 7/2007 | Higgins | H01P 1/2088 333/208 |
| 7,251,466 B2 | 7/2007 | Porret et al. | |
| 7,265,792 B2 | 9/2007 | Favrat et al. | |
| 7,305,223 B2 | 12/2007 | Liu et al. | |
| 7,327,406 B2 | 2/2008 | Utsunomiya et al. | |
| 7,395,548 B2 | 7/2008 | Runzo | |
| 7,459,963 B2 | 12/2008 | Kimura | |
| 7,522,017 B1 * | 4/2009 | Groe | H03H 7/0153 333/175 |
| 7,577,413 B2 | 8/2009 | He | |
| 7,620,379 B2 | 11/2009 | Isaac | |
| 7,869,780 B2 | 1/2011 | Youssoufian et al. | |
| 7,899,431 B2 | 3/2011 | Rahman et al. | |
| 7,973,603 B2 | 7/2011 | Kammula | |
| 8,103,233 B2 | 1/2012 | Im | |
| 8,185,076 B2 | 5/2012 | Miura et al. | |
| 8,301,208 B2 | 10/2012 | Katsube et al. | |
| 8,653,886 B2 | 2/2014 | Hellberg | |
| 2001/0007151 A1 * | 7/2001 | Vorenkamp | H01F 17/0006 725/151 |
| 2003/0045263 A1 | 3/2003 | Wakayama et al. | |
| 2005/0040909 A1 | 2/2005 | Waight | |
| 2005/0070235 A1 | 3/2005 | Matsuura | |
| 2006/0040628 A1 | 2/2006 | Porret et al. | |
| 2006/0064725 A1 | 3/2006 | Rabinowitz et al. | |
| 2006/0078069 A1 | 4/2006 | Seendripu et al. | |
| 2006/0223474 A1 | 10/2006 | Yoshizaki et al. | |
| 2007/0123176 A1 * | 5/2007 | Han | H04B 1/30 455/84 |
| 2007/0165143 A1 | 7/2007 | Utsunomiya et al. | |
| 2008/0096508 A1 | 4/2008 | Luff | |
| 2008/0181337 A1 | 7/2008 | Maxim | |
| 2008/0198269 A1 | 8/2008 | Gomez | |
| 2009/0176467 A1 | 7/2009 | Im | |
| 2009/0251618 A1 | 10/2009 | Gao | |
| 2010/0097531 A1 | 4/2010 | Miura et al. | |
| 2010/0130155 A1 | 5/2010 | Khoini-Poorfard | |
| 2011/0098013 A1 | 4/2011 | Takahashi et al. | |
| 2011/0316654 A1 * | 12/2011 | Meng | H03J 5/244 334/55 |
| 2012/0302188 A1 | 11/2012 | Sahota | |
| 2012/0306588 A1 | 12/2012 | Mcculloch et al. | |
| 2013/0095779 A1 | 4/2013 | Katsube et al. | |
| 2014/0070984 A1 * | 3/2014 | Rofougaran | H01G 5/16 342/200 |
| 2014/0106669 A1 | 4/2014 | Krishnan et al. | |
| 2014/0160608 A1 | 6/2014 | Mo et al. | |

OTHER PUBLICATIONS

"Novel LC Pseudo Switched Capacitor Filter Suited for Wireless RF Applications," Ahmed El Oualkadi et al., IEICE Electronics Express, vol. 2, No. 8, Apr. 2005, pp. 286-291.

Actions on the Merits for U.S. Appl. No. 14/612,232, filed Feb. 2, 2015 which is the parent application of 1052-3108; Actions on the Merits for U.S. Appl. No. 13/468,824, filed May 10, 2012; and Actions on the Merits for U.S. Appl. No. 13/342,548, filed Jan. 3, 2012.

* cited by examiner

LOW-COST RECEIVER USING INTEGRATED INDUCTORS

This application is a division of prior application Ser. No. 14/612,232, filed Feb. 2, 2015, which is a division of prior application Ser. No. 13/468,824, filed May 10, 2012, now U.S. Pat. No. 8,983,417, which is a continuation-in-part of prior application Ser. No. 13/342,548, filed Jan. 3, 2012, now U.S. Pat. No. 8,725,103, entitled "Receiver Including a Tracking Filter," invented by Mustafa H. Koroglu and Yu Su.

FIELD OF THE DISCLOSURE

The present disclosure is generally related to receiver circuits, and more particularly to receiver circuits configurable to receive ultra high frequency and very high frequency broadcast radio frequency signals.

BACKGROUND

Receiver circuits are used for both terrestrial and cable reception within televisions, digital video recorders, video cassette records, set-top box devices (such as cable and satellite tuners), frequency modulation (FM) radios, models, and other electronic devices. Some smart phones also utilize receiver circuits for television reception. In general, such receiver circuits include a tuner that selects a narrowband signal from within a wide or broad-band signal having multiple channels. The tuner includes bandpass filters, amplifiers, and mixer circuits for selecting a desired channel and for rejecting unwanted channels, noise and interference.

Television signals can be broadcast at a variety of different frequencies, including ultra-high frequency (UHF), very high frequency (VHF), and high frequency (HF) frequency bands. The International Telecommunications Union (ITU) defines the UHF frequency range as encompassing electromagnetic waves between 300 MHz and 3 GHz. VHF occupies frequencies within a range from approximately 30 MHz to 300 MHz, and HF occupies frequencies within a range from approximately 3 MHz to 30 MHz.

For a conventional tracking filter, multiple bandpass filters are included to cover the range of possible frequencies, each tuned to a limited portion of the overall bandwidth of the receiver. For each filter, a large tuned impedance is desirable to minimize the noise figure; however, the tuned impedance is typically a function of the frequency and the size of the inductor, which size can limit the frequency range for the particular filter.

Recently developed integrated circuit processes have allowed inductors to be built with sufficiently large inductance to be integrated with conventional signal processing circuitry on a common complementary-metal-oxide-semiconductor (CMOS) chip. However the inductors are relatively large, and to increase the inductance it may be necessary to either increase the size or decrease the quality factor of the inductor. A new receiver that is able to relax this tradeoff would be desirable.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

Embodiments of a receiver circuit are described below that include a low noise amplifier for receiving a radio frequency signal and including an output coupled to an input of a tracking filter configured to receive very high frequency ($VHF_{LO}$ and $VHF_{HI}$) and UHF broadcast signals. As used herein, $VHF_{LO}$ signals refer to radio frequency signals in a range of approximately 50 to 190 MHz, $VHF_{HI}$ signals refer to radio frequency signals in a range of approximately 190 to 470 MHz, and UHF signals refer to radio frequency signals in a range of approximately 470 to 860 MHz. The $VHF_{LO}$ portion of the tracking filter includes a low pass filter for receiving $VHF_{LO}$ broadcast signals and that utilizes inductive peaking to extend an upper frequency range (or limit) of the low-pass filter. The $VHF_{LO}$ portion of the tracking filter includes a single-to-differential amplifier having an input coupled to the output of the low noise amplifier, and having a first output and a second output. The $VHF_{LO}$ portion of the tracking filter further includes a band-pass filter coupled between the first and second outputs, which band-pass filter can be an inductive-capacitive filter. The UHF portion of the tracking filter uses a transformer in place of a single-to-differential amplifier. The transformer includes a primary winding coupled to the output of the low noise amplifier and a secondary winding magnetically coupled to the primary winding. The secondary winding is configured to include more turns than the primary winding in order to provide a signal gain between the primary and secondary windings. An example of one possible embodiment of a receiver circuit having a filter configured for $VHF_{LO}$, $VHF_{HI}$, and UHF reception is described below with respect to FIG. 1.

Figure 1:
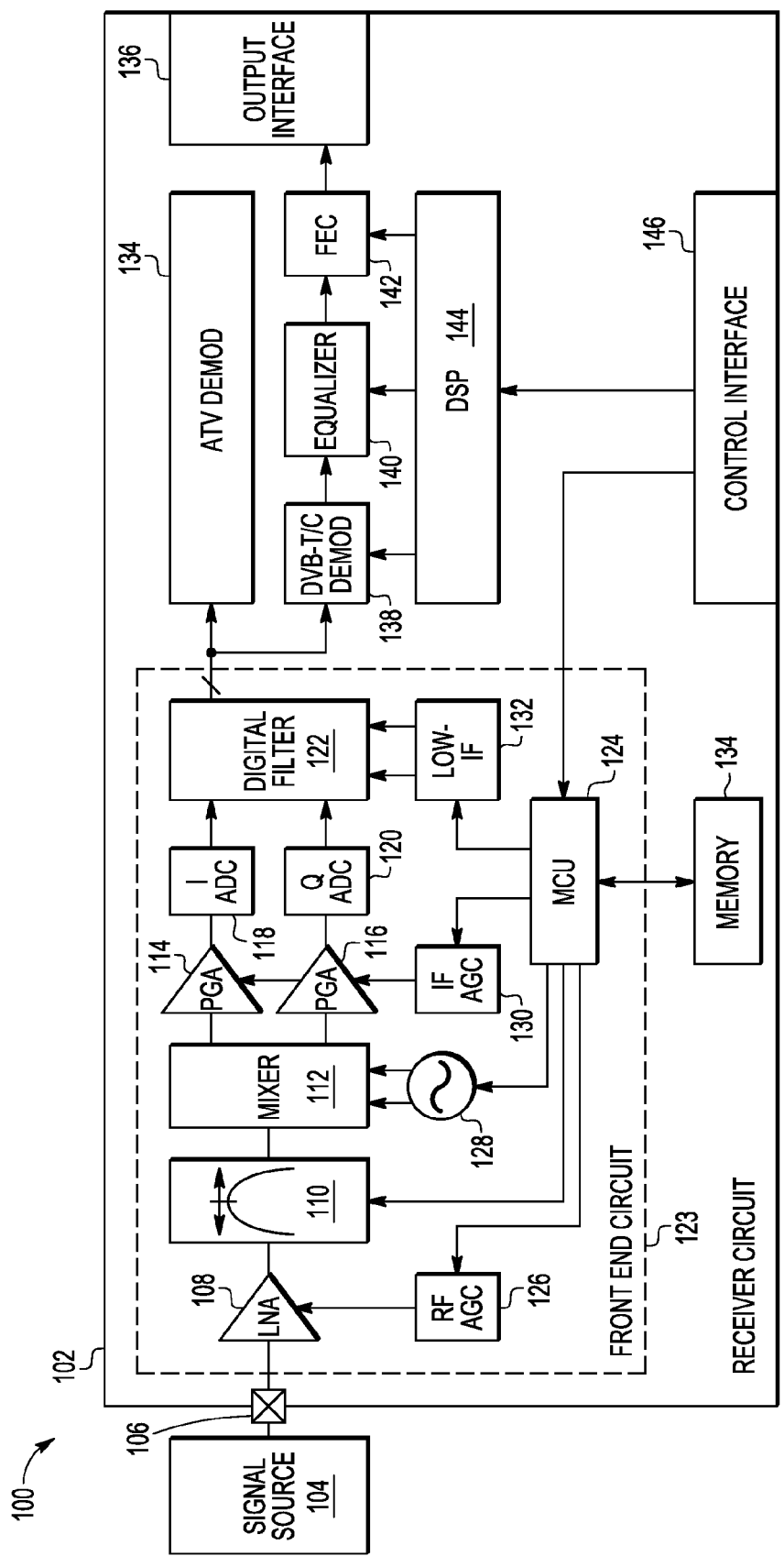
FIG. 1 is a block diagram of an embodiment of a system including a receiver circuit having a tracking filter configurable to receive $VHF_{LO}$, $VHF_{HI}$, and UHF broadcast signals.

FIG. 1 is a block diagram of an embodiment of a system 100 including a receiver circuit 102 having a tracking filter 110 configurable to receive $VHF_{LO}$, $VHF_{HI}$, and UHF broadcast signals. System 100 includes a signal source 104 coupled to receiver circuit 102 through an input terminal or pad 106. Signal source 104 can be an antenna, a coaxial cable, or other signal source for delivering radio frequency broadcast signals to pad 106. Receiver circuit 102 includes a front end circuit 123, which includes a low-noise amplifier (LNA) 108 having an input coupled to pad 106 and an output coupled to an input of a tracking filter 110. Tracking filter 110 includes a control input coupled to microcontroller unit 124 and an output coupled to an input of a mixer 112.

Mixer 112 includes inputs for receiving an oscillator signal from a local oscillator 128. Mixer 112 further includes an output for providing an in-phase signal to a programmable gain amplifier (PGA) 114 and an output for providing a quadrature signal to PGA 116. PGA 114 includes an output coupled to an analog-to-digital converter (ADC) 118, which has an output coupled to an input of a digital filter 122. PGA 116 includes an output coupled to ADC 120, which has an output coupled to an input of digital filter 122.

Front end circuit 123 also includes a radio frequency automatic gain control (AGC) circuit 126 including an input coupled to an output of MCU 124 and an output coupled to an input of LNA 108. MCU 124 is also coupled to local oscillator 128 to control the frequency of the local oscillator signals. Front end circuit 123 further includes an intermediate frequency (IF) AGC circuit 130 including a control input coupled to an output of MCU 124 and outputs coupled to PGAs 114 and 116. Front end circuit 123 also includes a low-IF circuit 132 having a control input coupled to an output of MCU 124 and includes outputs coupled to inputs of digital filter 122. MCU 124 is also coupled to memory 148, which may store instructions and/or data that can be used by MCU 124 to control operation of the front end circuit 123.

Receiver 102 further includes an analog television demodulator 134 having an input coupled to an output of digital filter 122 and an output coupled to an input of an output interface 136. Receiver 102 also includes a digital video broadcast terrestrial/cable (DVB-T/C) demodulator 138 having an input coupled to the output of digital filter 122, an input coupled to an output of digital signal processor (DSP) 144, and an output coupled to an input of equalizer 140. Equalizer 140 includes an input coupled to an output of DSP 144, and an output coupled to an input of a forward error correction (FEC) circuit 142, which has a second input coupled to an output of DSP 144 and an output coupled to an input of output interface 136. DSP 144 includes a control input coupled to an output of a control interface 146, which may be coupled to a host system for receiving control and other signals. Control interface 146 also includes an output coupled to MCU 124.

Digital filter 122 provides the output signals to tuner circuitry, including analog television demodulator 134 and DVB-T/C demodulator 138, which demodulate the video signal. Analog television demodulator 134 provides the demodulated output to output interface 136, which may be coupled to an audio/video system on a chip or other multimedia circuit. DVB-T/C demodulator 138 provides the output to equalizer 140, which adjusts the relative strength of selected frequencies within the demodulated output signal and provides the adjusted signal to FEC 142. FEC 142 uses forward error correction to correct signal errors and provides the corrected signal to output interface 136.

In this example, tracking filter 110 includes a low-pass filter portion for receiving and filtering $VHF_{LO}$ broadcast signals, a second filter portion for receiving and filtering $VHF_{HI}$ broadcast signals, and a third filter portion for receiving and filtering UHF broadcast signals. In an example, the low-pass filter portion includes a single-to-differential amplifier that includes an inductor/capacitor bandpass filter at the outputs and uses inductive peaking to extend the bandwidth range. The third portion of the filter eliminates the single-to-differential amplifier and replaces it with a transformer having a primary winding with a relatively high quality factor (Q) and a secondary winding with a much lower Q. The transformer can provide approximately a 3 decibel (3 dB) gain. By introducing a gain between the primary and second windings, any impact of limited linearity of the output of LNA 108 on overall system linearity is also reduced.

By adjusting the $VHF_{LO}$ and UHF filter portions, the overall number of inductive-capacitive (LC) filters through the tracking filter 110 can be reduced. In an example, the frequency range over which the receiver 102 operates can be divided into an upper range, a mid-range, and a low range of frequencies, thereby reducing the overall complexity of the tracking filter.

In conventional tracking filters, the input impedance of each filter is often designed to be large to minimize the noise figure. To achieve the high tuned impedance, the size of the inductor is increased, which limits the maximum tuned frequency for each filter. Accordingly, a number of filters are included to provide filtering across the frequency range. A representative example of a receiver including a conventional tracking filter is described below with respect to FIG. 2.

Figure 2:
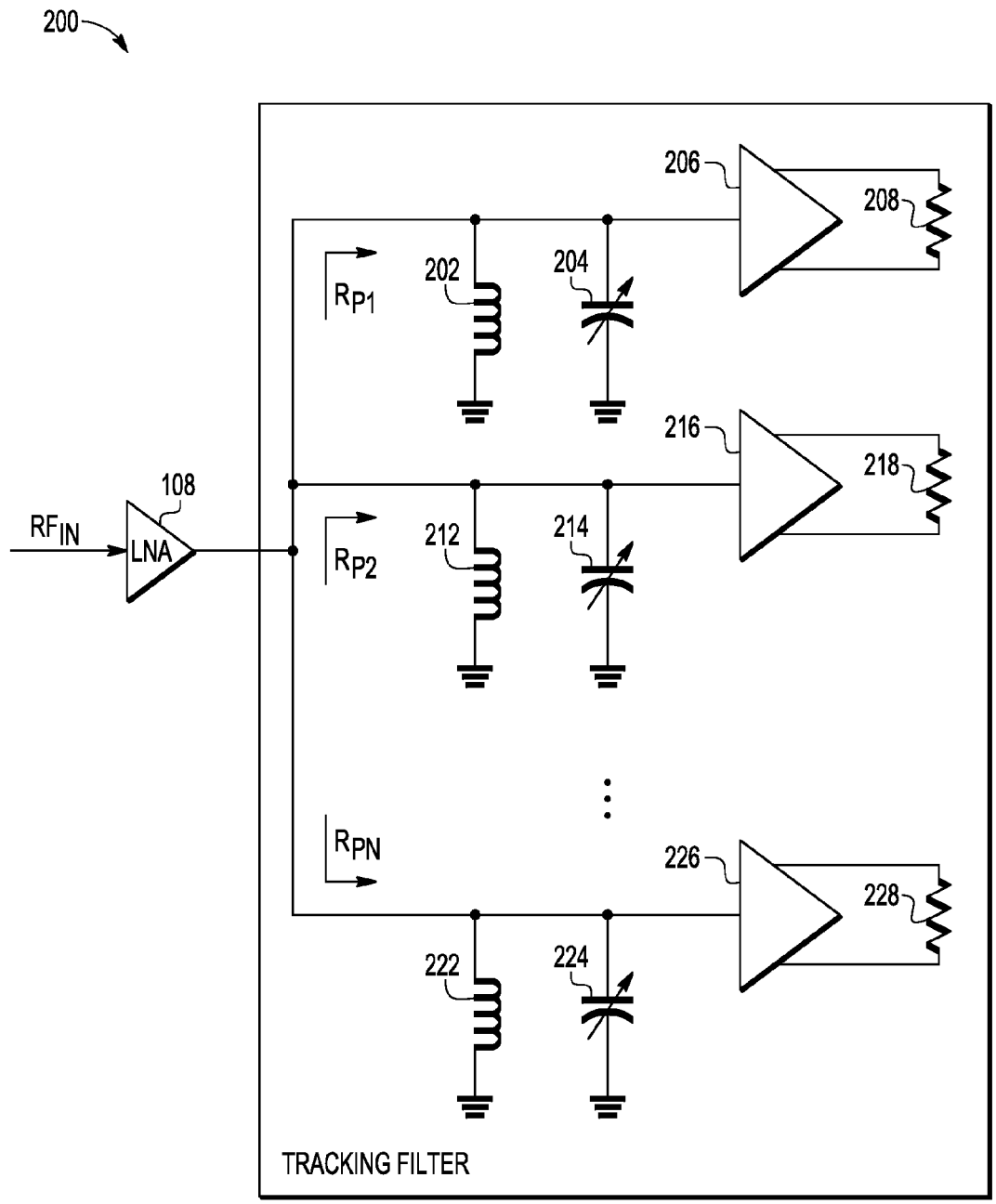
FIG. 2 is a circuit diagram of a representative example of a receiver including conventional tracking filter having a separate bandpass filter tuned for each frequency band.

FIG. 2 is a circuit diagram of a representative example of a receiver 200 including a conventional tracking filter 201 having a separate bandpass filter tuned for each frequency band. Receiver 200 includes LNA 108 having an input for receiving a radio frequency input signal ($RF_{IN}$) and an output coupled to an input of tracking filter 201.

Tracking filter 201 can include any number (N) of signal paths. In the illustrated example includes a first signal path including an inductor 202, a variable capacitor 204, a single-to-differential amplifier 206, and a resistor 208. Inductor 202 includes a first terminal coupled to the input of tracking filter 201 and a second terminal coupled to ground. Capacitor 204 includes a first electrode coupled to the input of tracking filter 201 and a second electrode coupled to ground. Single-to-differential amplifier 206 includes an input coupled to the input of tracking filter 201, a first output coupled to a first terminal of resistor 208 and a second output coupled to a second terminal of resistor 208.

Tracking filter 201 further includes a second signal path including an inductor 212, a variable capacitor 214, a single-to-differential amplifier 216, and a resistor 218. Inductor 212 includes a first terminal coupled to the input of tracking filter 201 and a second terminal coupled to ground. Capacitor 214 includes a first electrode coupled to the input of tracking filter 201 and a second electrode coupled to ground. Single-to-differential amplifier 216 includes an input coupled to the input of tracking filter 201, a first output coupled to a first terminal of resistor 218 and a second output coupled to a second terminal of resistor 218.

Tracking filter 201 also includes an N-th signal path including an inductor 222, a variable capacitor 224, a single-to-differential amplifier 226, and a resistor 228. Inductor 222 includes a first terminal coupled to the input of tracking filter 201 and a second terminal coupled to ground. Capacitor 224 includes a first electrode coupled to the input of tracking filter 201 and a second electrode coupled to ground. Single-to-differential amplifier 226 includes an input coupled to the input of tracking filter 201, a first output coupled to a first terminal of resistor 228 and a second output coupled to a second terminal of resistor 228.

In an example, resistors 208, 218, and 228 are approximately ninety ohm resistors and inductors 202, 212, and 222 have widths and lengths of approximately 600 µm×600 µm. The input impedances ($R_{P1}$, $R_{P2}$, . . . , and $R_{PN}$) for each of the signals paths (1 through N) is large enough to achieve a low noise factor. For some receivers, the input impedances between 400 Ohms and 800 Ohms. For tuned inductive LC filters, the tuned impedance is given by Rp=w$_0$*L*Q where w$_0$ is the resonant frequency, L is the inductance, Q is the quality factor, and Rp is the input impedance. For on-chip inductors, the quality factor (Q) is substantially constant for a given area and Q is proportional to the square root of the inductor area. To synthesize the desired impedance, the size of inductors 202, 212, and 222 is increased to improve Q or the inductance value is increased to avoid increased inductor area. However, large inductance values limit the maximum tuned frequency according to the following equation:

$$\omega\max = \frac{1}{\sqrt{L_N * C_T}} \quad (1)$$

where the variable (C$_T$) represents a total parasitic capacitance. Unfortunately, this limitation increases the number of filters that are included in tracking filter 201 in order to provide the desired channel tuning.

To reduce the number of signal paths and thus the number of LC filters, tracking filter 110 of FIG. 1 extends each transfer function to cover a wider frequency band, reducing the number of signal paths and thus reducing the complexity of the circuit. An example of a tracking filter that provides three transfer functions is described below with respect to FIG. 3.

Figure 3:
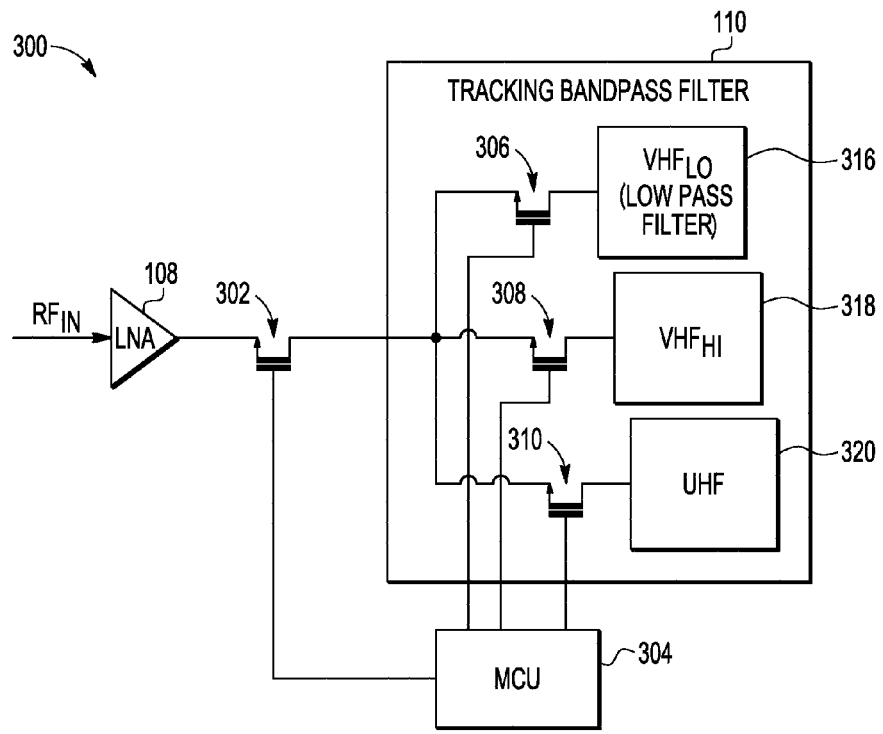
FIG. 3 is a block diagram of an embodiment of a portion of a receiver including a tracking bandpass filter having a $VHF_{LO}$ filter, a $VHF_{HI}$ filter, and a UHF filter.

FIG. 3 is a block diagram of an embodiment of a portion of a receiver 300 including a tracking filter 110 having a VHF$_{LO}$ filter 316, a VHF$_{HI}$ filter 318, and a UHF filter 320. Receiver 300 includes LNA 108 having an input for receiving a radio frequency input signal (RF$_{IN}$) and an output coupled to a source of a transistor 302. Transistor 302 includes a gate coupled to an output of an MCU 304, and a drain coupled to an input of tracking filter 110. Tracking filter 110 includes a transistor 306 having a source coupled to the input of tracking filter 110, a gate coupled to MCU 304, and a drain coupled to an input of VHF$_{LO}$ filter 316, which is implemented as a low pass filter. Tracking filter 110 further includes a transistor 308 having a source coupled to the input of tracking filter 110, a gate coupled to MCU 304, and a drain coupled to an input of VHF$_{HI}$ filter 318. Tracking filter 110 also includes a transistor 310 having a source coupled to the input of tracking filter 110, a gate coupled to MCU 304, and a drain coupled to an input of UHF filter 320.

During operation, MCU 304 selectively enables the signal path between LNA 108 and one of the filters 316, 318, and 320. In an example, MCU 304 activates transistors 302 and 306 to provide the output of LNA 108 to the input of VHF$_{LO}$ filter 316. In this instance, the VHF$_{LO}$ filter 316 is a low-pass filter that passes frequencies within the tuning range from approximately 50 MHz to approximately 190 MHz. There are no television channels below a frequency of 50 MHz, thus VHF$_{LO}$ filter 316 can be configured to low pass filter operation. Toward the higher end of the range (i.e., as the frequency approaches approximately 190 MHz, the bandwidth of the VHF$_{LO}$ filter 316 is extended by using inductive peaking to extend the tuning range. An example of the VHF$_{LO}$ filter 316 illustrating one possible circuit configuration is described below with respect to FIG. 4.

Figure 4:
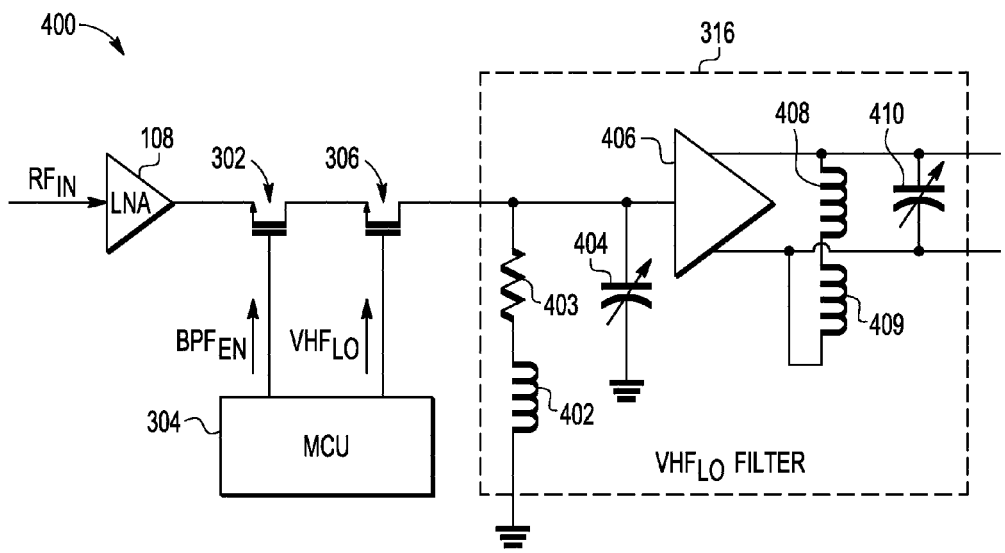
FIG. 4 is a diagram of an embodiment of the $VHF_{LO}$ filter of FIG. 3.

FIG. 4 is a diagram of an embodiment of a receiver 400, such as receiver 300 in FIG. 3, including the VHF$_{LO}$ filter 316. VHF$_{LO}$ filter 316 includes an inductor 402 and a resistor 403. Resistor 403 has a first terminal coupled to the source of transistor 306 and has a second terminal coupled to a first terminal of inductor 402, which has a second terminal coupled to ground. In this instance, resistor 403 represents the series resistance of inductor 402. VHF$_{LO}$ filter 316 further includes a variable capacitor 404 having a first electrode coupled to the drain of transistor 306 and a second electrode coupled to ground. VHF$_{LO}$ filter 316 also includes a single-to-differential amplifier 406 having a first output and a second output. Inductors 408 and 409 are connected in series between the first and second outputs. Additionally, a variable capacitor 410 includes a first electrode coupled to the first output and a second electrode coupled to the second output. The first and second outputs may be coupled to a load, such as a ninety ohm resistance.

In this example, the input impedance of VHF$_{LO}$ filter 316 is mostly provided by the series resistance of the inductor 402 at low frequencies. At higher frequencies, inductor 402 extends the bandwidth through inductive peaking. The quality factor requirements are relaxed substantially making it possible to use a smaller inductor. However, the smaller inductance and correspondingly smaller input impedance sacrifices some rejection at the higher and the lower side of the frequency band. To improve rejection, VHF$_{LO}$ filter 316 includes an inductive/capacitive (LC) bandpass filter at the outputs of the single-to-differential amplifier 406 using inductors 408 and 409 and variable capacitor 410. Instead of using a single 600 μm×600 μm inductor, VHF$_{LO}$ filter 316 includes three 150 μm×150 μm inductors, reducing the overall circuit area while extending the frequency range of VHF$_{LO}$ filter 316 relative to filters in tracking filter 201 in FIG. 2.

In the above example, VHF$_{LO}$ filter 316 from FIG. 3 uses an LC filter on the output of the single-to-differential amplifier to provide additional filtering. As the impedance level at the single-to-differential amplifier output is much smaller (about 90 Ohms), small-size, low-Q inductors can be used to implement the bandpass filter at the output of the single-to-differential amplifier. Thus, a high Q bandpass filter with a very large inductor is replaced by two lower-Q LC filters using much smaller inductors resulting in a reduced overall inductor area. The UHF filter 320 of FIG. 3 eliminates the active single-to-differential amplifier, reducing power consumption and improving the noise figure and linearity of the overall system. In place of the single-to-differential amplifier, UHF filter 320 introduces a transformer with a gain and with different Q factors between the primary and secondary inductive windings. By introducing a gain between the primary and secondary, the impact of the limited linearity of LNA 108 on overall system linearity is reduced. An example of a UHF filter 320 that uses a transformer instead of a single-to-differential amplifier is described below with respect to FIG. 5.

Figure 5:
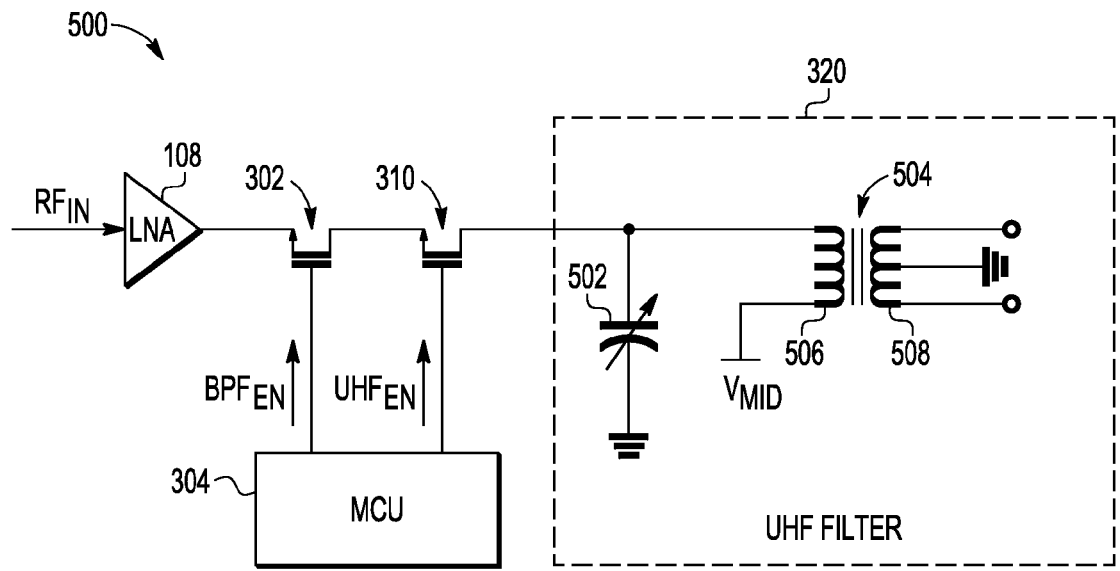
FIG. 5 is a diagram of an embodiment of the UHF filter of FIG. 3.

FIG. 5 is a diagram of an embodiment of a receiver 500 including the UHF filter 320 of FIG. 3. In this example, UHF filter 320 includes a variable capacitor 502 and an transformer 504. Variable capacitor 502 includes a first electrode coupled to the drain of transistor 310 and a second electrode coupled to ground. Transformer 504 includes a primary inductive winding 506 having a first terminal coupled to the drain of transistor 310 and a second terminal coupled to a supply voltage (such as a voltage approximately midway between the supply voltage rails, labeled "V$_{MID}$"). Transformer 504 further includes a secondary inductive winding 508 having a first terminal and a second terminal, which can be coupled to mixer 112, and including a center tap coupled to ground.

In the illustrated example, the primary inductive winding 506 has a higher Q than the Q of the secondary inductive winding 508. Additionally, the transformer 504 introduces a gain from the primary inductive winding 506 to the secondary inductive winding 508. In one instance, the gain is approximately 3 dB. In an example, the secondary inductive winding 508 of transformer 504 has more turns than the primary inductive winding 506, providing the gain.

In a particular embodiment, the primary inductive winding 506 is formed from approximately 3.4 μm of high quality copper (Cu), such as Cu M8, and approximately 2.8 μm of aluminum (Al). In this embodiment, the secondary inductive winding 508 is formed from lower quality metal, such as Cu M4 or M5 and each has approximately 0.2 μm of Cu. The primary and secondary inductive windings 506 and 508 can be patterned in redistribution layers of the semiconductor substrate. The secondary inductive winding 508 is formed from lower metals to improve the self-resonant frequency response of transformer 504. Further, the coupling coefficient is very strong (approximately k=1). A small signal model of an example of the UHF filter 320 is described below with respect to FIG. 6.

Figure 6:
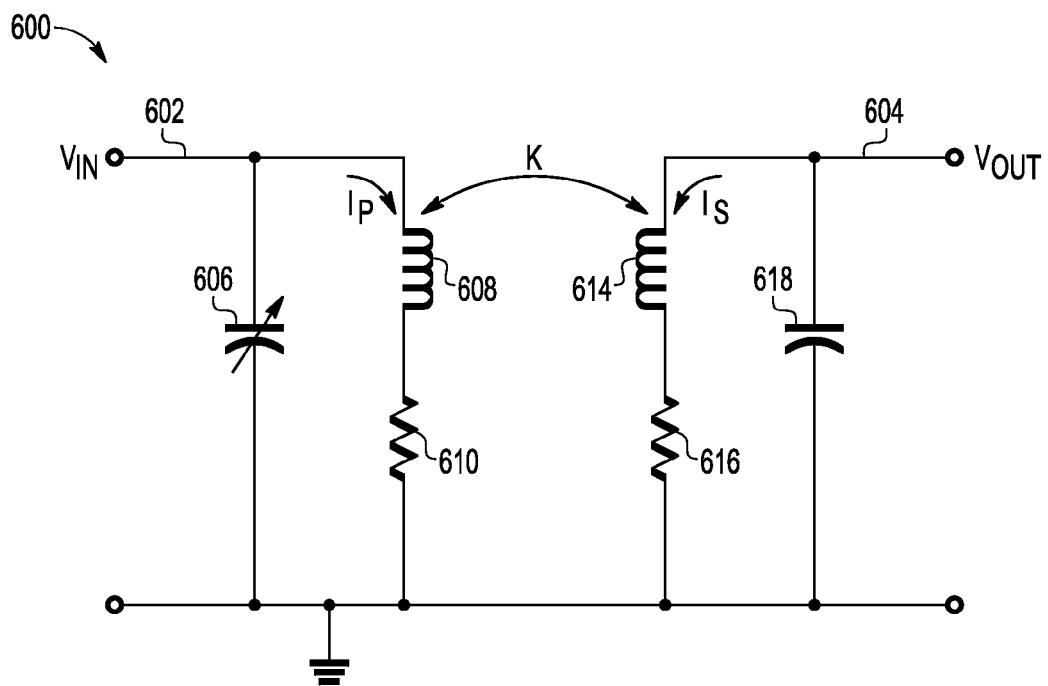
FIG. 6 is an embodiment of a small signal model of the UHF Filter of FIG. 5.

FIG. 6 is an embodiment of a small signal model 600 of the UHF Filter of FIG. 5. Small signal model 600 includes an input voltage terminal 602 for receive an input voltage ($v_{in}$) and an output voltage terminal 604 for providing an output voltage ($v_{out}$). Small signal model 600 includes variable capacitor 606 coupled between input voltage terminal 602 and ground. Variable capacitor 606 may represent variable capacitor 502 in FIG. 5 as well as a parasitic capacitance of the primary winding 506 of transformer 504 in FIG. 5. Small signal model 600 further includes an inductor 608 and a resistor 610 connected in series between input voltage terminal 602 and ground. Secondary winding 508 of transformer 504 in FIG. 5 is modeled as an inductor 614 and a resistor 616 connected in series between output voltage terminal 604 and ground. Additionally, a secondary capacitor 618 is coupled between output voltage terminal 604 and ground.

Assuming that the primary inductive winding 506 is tuned to a resonant frequency ($\omega_0$) while the secondary inductive winding 508 is not tuned, resonant frequency of the secondary winding ($\omega_s$) is much greater than the resonant frequency ($\omega_0$) as follows:

$$\omega s = \frac{1}{\sqrt{L_{614} C_{618}}} \quad (2)$$

where $L_{614}$ represents the inductance of inductor 614 and $C_{618}$ represents the capacitance of capacitor 618. The coupling between the primary and the secondary inductive windings 506 and 508 is very strong (k is approximately equal to 1). The current into the secondary winding ($i_s$) is determined according to the following equation:

$$i_s = \frac{-j\omega M i_p}{\frac{1}{j\omega C_{618}} + j\omega L_{614} + R_{616}} = -j\omega M i_p \frac{1}{\frac{1-\omega^2 L_{614} C_{618}}{j\omega C_{618}} + R_{616}} \quad (3)$$

wherein $R_{616}$ represents the resistance of resistor 616, the frequency ($\omega$) represents the input frequency, and the variable (M) is determined by the following equation:

$$M = k\sqrt{L_{608} L_{614}} \quad (4)$$

Since k=1, for frequencies around the resonant frequency ($\omega_0$), the current into the secondary winding 508 can be determined according to the following equation:

$$i_s = i_p \frac{\omega^2 M C_{614}}{1 + j\omega R_{616} C_{618}} \quad (5)$$

where $i_s$ is the current flowing in the secondary inductive winding 508 and $i_p$ is the current flowing in the primary inductive winding 506.

In the illustrated example, the input voltage ($v_{in}$) is determined by the following equation:

$$v_{in} = (jwL_{608} + R_{610})i_p + j\omega M \frac{\omega^2 M C_{618}}{1 + j\omega R_{616} C_{618}} i_p \quad (6)$$

and the effective impedance ($Z_{eff}$) looking into the primary winding of the transformer is determined as follows:

$$Z_{eff} = \frac{v_{in}}{i_p} = j\omega L_{608} + R_{610} + \omega^2 M^2 \frac{j\omega C_{618}}{1 + j\omega R_{616} C_{618}} \quad (7)$$

In the equation 7, the factor $j\omega L_{608} + R_{610}$ is the impedance due to the primary inductive winding 506, and the remainder of the equation is the impedance due to the secondary inductive winding 508. Assuming that the factor $\omega R_{616} C_{618}$ is much smaller than 1, the effective impedance ($Z_{eff}$) simplifies as follows:

$$Z_{eff} = j\omega L_{608} + R_{610} + \omega^2 M^2 j\omega C_{618}(1-j\omega R_{616} C_{618}) = j\omega (L_{608} + \omega^2 M^2 C_{618}) + R_{610} + \omega^4 M^2 C_{618}^2 R_{616}^2 \quad (8)$$

The effective impedance due to the inductance ($L_{eff}$) is determined according to the following equation:

$$L_{eff} = L_{608} + \omega^2 M^2 C_{618} = L_{608}(1 + \omega^2 L_{614} C_{618}) = L_{608}\left(1 + \frac{\omega^2}{\omega_S^2}\right) \quad (9)$$

The effective impedance due to the resistance ($R_{eff}$) is determined according to the following equation:

$$R_{eff} = R_{610} + \omega^4 M^2 C_{618}^2 R_{616} = R_{610} + \left(\frac{\omega}{\omega_s}\right)^4 \frac{L_{608}}{L_{614}} R_{616} \quad (10)$$

In the above examples, if the ratio of the resonant frequency ($\omega_0$) to the frequency ($\omega_s$) is kept small, the secondary inductive winding 508 has limited effect on the tuned frequency of primary inductive winding 506. Additionally, by keeping this ratio small, the effect of the secondary inductive winding on the quality factor (Q) is also kept small. For example, if the ratio is approximately $\frac{1}{3}^{rd}$, and the resistance ($R_{616}$) is approximately 10 times the resistance of resistor 610, and if the inductances of inductors 608 and 614 are approximately equal, then the effective quality factor ($Q_{eff}$) can be determined by the following equation:

$$Q_{eff} \cong 0.99 \frac{\omega L_{608}}{R_{610}} \quad (11)$$

Further, on the secondary side, the output voltage ($v_{out}$) relates to the input voltage ($v_{in}$) according to the following equation:

$$v_{out} = v_{in} \sqrt{\frac{L_{614}}{L_{608}}} \quad (12)$$

Equation 12 demonstrates a conversion gain in transformer 504. At higher frequencies, it can be demonstrated that the secondary inductive winding 508 acts as a second order inductive/capacitive (LC) low-pass filter on top of the LC bandpass characteristics of the primary inductive winding 506.

Thus, the single-ended to differential conversion provided by a single-to-differential amplifier in the prior art can be replaced by performing the conversion magnetically with a transformer 504 having a secondary inductive winding 508 with a low quality factor. The effect of the secondary inductive winding 508 on the quality factor of the primary inductive winding 506 is proportional to the fourth power of the frequency. Accordingly, the quality factor and hence the gain of the LNA 108 decreases with increased tuned frequency, which helps to reduce the gain variation in the transfer function of the UHF filter 320. Further, as discussed, it is possible to implement a conversion gain of more than 0 dB by adjusting a number of turns on the secondary inductive winding 508 to provide the gain. By introducing such a gain, the transformer 504 operates to reduce the signal level at the output of LNA 108, improving the in-band third-order intercept point (IIP3) of the LNA 108 by providing the gain in the transformer 504.

In conjunction with the circuits described above with respect to FIGS. 1-6, a receiver is disclosed that includes a tracking filter having a reduced number of LC filters relative to conventional tracking filters for television reception. In particular, the tracking filter divides the frequency range into three bands ($VHF_{LO}$, $VHF_{HI}$, and UHF), and provides a low-pass filter for the $VHF_{LO}$ frequencies, a bandpass filter for the $VHF_{HI}$ frequencies, and a transformer-based bandpass filter for UHF broadcast signals.

Figure 7:
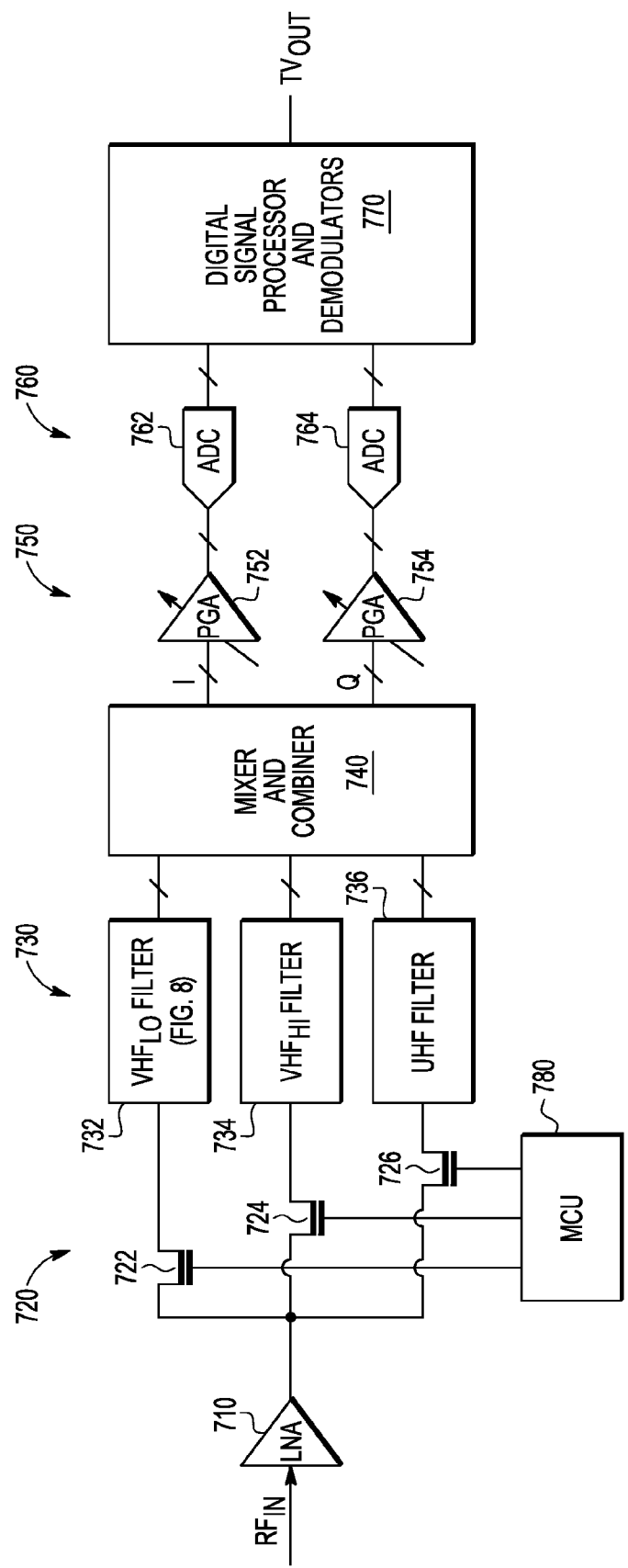
FIG. 7 is a block diagram of a low-cost television receiver according to an embodiment of the present invention.

FIG. 7 is a block diagram of a low-cost television receiver 700 according to an embodiment of the present invention. Receiver 700 includes generally a low noise amplifier (LNA) 710, a switch section 720, a filter section 730, a mixer and combiner 740, an amplifier section 750, an analog-to-digital converter (ADC) section 760, a digital signal processor and demodulator section 770, and a microcontroller 780.

LNA 710 has an input for receiving input signal $RF_{IN}$, and an output for providing an amplified $RF_{IN}$ signal. Switch section 720 includes three N-channel transistors 722, 724, and 726. Transistor 722 has a first source/drain terminal connected to the output of LNA 710, a gate, and a second source-drain terminal. Transistor 724 has a first source/drain terminal connected to the output of LNA 710, a gate, and a second source-drain terminal. Transistor 726 has a first source/drain terminal connected to the output of LNA 710, a gate, and a second source-drain terminal.

Filter section 730 includes a first filter labeled "$VHF_{LO}$ FILTER" 732, a second filter labeled "$VHF_{HI}$ FILTER" 734, and a third filter labeled "UHF FILTER" 736. Filter 732 has an input connected to the second terminal of transistor 722, a tuning input, and an output for providing a filtered differential signal. Filter 734 has an input connected to the second terminal of transistor 724, a tuning input, and an output for providing a filtered differential signal. Filter 736 has an input connected to the second terminal of transistor 726, a tuning input, and an output for providing a filtered differential signal.

Mixer and combiner 740 has inputs connected to respective outputs of filters 732, 734, and 736, a first output for providing a differential in-phase signal labeled "I", and a second output for providing a differential quadrature signal labeled "Q".

Amplifier section 750 includes programmable gain amplifiers (PGAs) 752 and 754. PGA 752 has a differential input coupled to the first output of mixer and combiner 740, a gain control input, and a differential output. PGA 754 has a differential input coupled to the second output of mixer and combiner 740, a gain control input, and a differential output.

ADC section 760 includes ADCs 762 and 764. ADC 762 has a differential input connected to the output of PGA 752, and a multi-bit digital output. ADC 764 has a differential input connected to the output of PGA 754, and a multi-bit digital output.

Digital signal processor and demodulator 770 has a first input connected to the output of ADC 762, a second input connected to the output of ADC 764, and an output for providing a signal labeled "$TV_{OUT}$".

MCU 780 has a first output connected to the gate of transistor 722, a second output connected to the gate of transistor 724, a third output connected to the gate of transistor 726, and a set of outputs not specifically shown in FIG. 7 connected to various other blocks as will be described further below.

In operation, receiver 700 is part of a highly integrated low-cost television receiver. LNA 710 receives the $RF_{IN}$ signal from an antenna or other signal source (not shown in FIG. 7), and provides the amplified $RF_{IN}$ signal to a selected one of three signal processing paths depending on the frequency band of the desired channel. In response to a tuning input (not shown in FIG. 7), MCU 780 under the control of firmware selects the appropriate signal processing path by activating one of the signals driving the gates of transistors 722, 724, and 726. In receiver 700, if the desired channel falls in the 50-190 MHz range, then MCU 780 activates the signal to the gate of transistor 722 and receiver 700 forms $TV_{OUT}$ from the amplified $RF_{IN}$ signal using $VHF_{LO}$ filter 732. If the desired channel falls in the 190-470 MHz range, then MCU 780 activates the signal to the gate of transistor 724 and receiver 700 forms $TV_{OUT}$ from the amplified $RF_{IN}$ signal using $VHF_{HI}$ filter 734. Filter 734 is a parallel resonant LC filter and includes a single-ended to differential converter. If the desired channel falls in the 470-860 MHz range, then MCU 780 activates the signal to the gate of transistor 726 and receiver 700 forms $TV_{OUT}$ from the amplified $RF_{IN}$ signal using UHF filter 736. Filter 736 is implemented as described with respect to FIGS. 5 and 6 above.

Receiver 700 is suitable for very low cost applications by using several techniques. First, receiver 700 is fully integrated onto a single integrated circuit chip without expensive external components by using on-chip inductors now available in state-of-the-art CMOS processes. Second, filter section 730 uses only three bands instead of the five bands that receiver 200 of FIG. 2 uses. Third, UHF filter 736 uses an on-chip transformer in conjunction with a variable capacitor to accomplish both bandpass filtering as well as single-ended to differential conversion, thus saving circuit area required by an additional amplifier as well as improving the dynamic range of receiver 700.

Fourth, $VHF_{LO}$ filter 732 uses a low-Q RLC filter and a low-Q LC bandpass filter that are smaller in area than a conventional parallel resonant LC filter, while providing most of the benefits of such a filter. The construction and characteristics of this filter will now be described.

Figure 8:
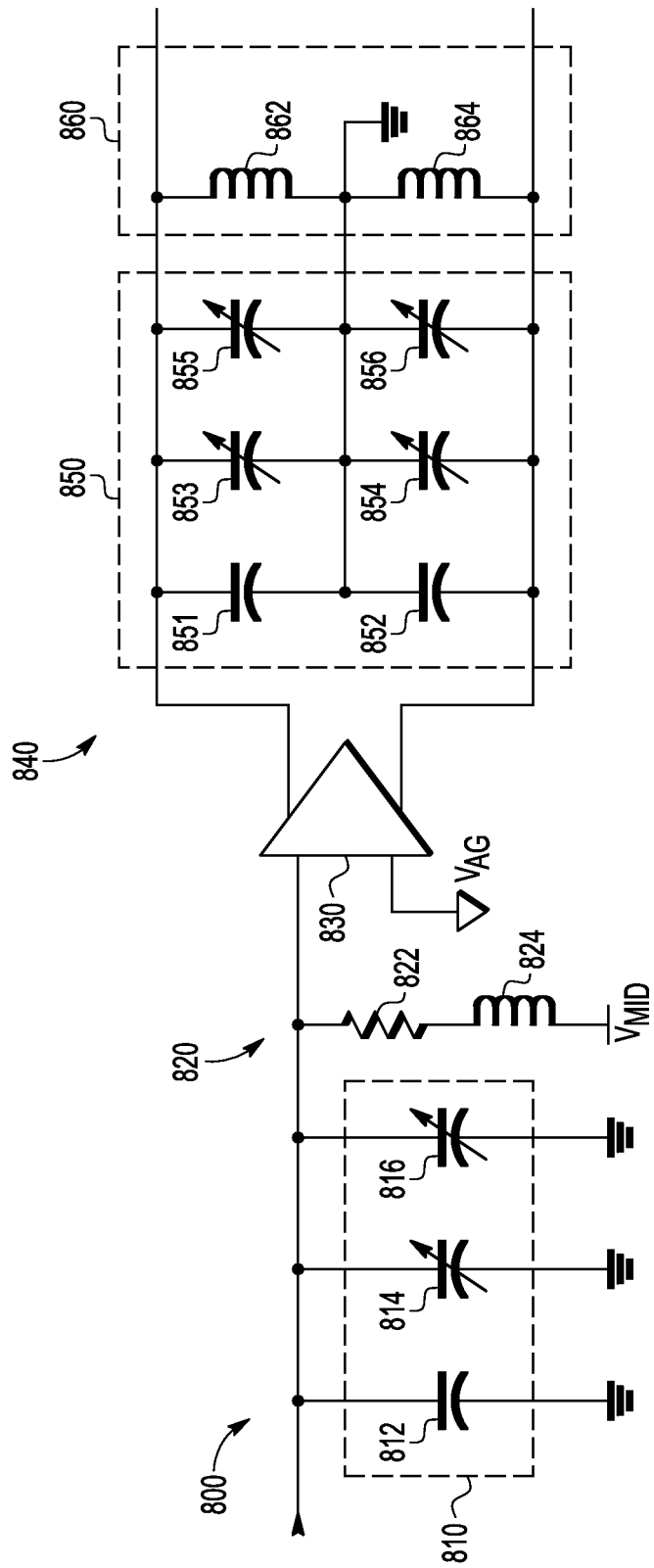
FIG. 8 illustrates in schematic form the $VHF_{LO}$ filter of FIG. 7.

FIG. 8 illustrates in schematic form $VHF_{LO}$ filter 732 of FIG. 7. Filter 732 includes generally an RLC lowpass filter 800, an amplifier 830, and a bandpass filter 840. Filter 800 includes a variable capacitor 810 and an inductance leg 820. Variable capacitor 810 includes a fixed capacitor 812, a binary-coded capacitor 814, and a thermometer-coded capacitor 816. Fixed capacitor 812 has a first terminal for receiving the amplified $RF_{IN}$ signal, and a second terminal connected to ground. Binary-coded capacitor 814 has a first terminal for receiving the amplified $RF_{IN}$ signal, a second terminal connected to ground, and a tuning input terminal for receiving a binary-coded tuning signal. Thermometer-coded capacitor 816 has a first terminal for receiving the amplified $RF_{IN}$ signal, a second terminal connected to ground, and a tuning input terminal for receiving a thermometer-coded tuning signal. Inductance leg 820 includes a resistor 822 and an inductor 824. Resistor 822 has a first terminal for receiving the amplified $RF_{IN}$ signal, and a second terminal. Inductor 824 has a first terminal connected to the second terminal of resistor 822, and a second terminal connected to $V_{MID}$.

Amplifier 830 has a first input terminal for receiving the amplified $RF_{IN}$ signal, a second input terminal connected to a voltage labeled "$V_{AG}$", and first and second output terminals for providing a differential output signal pair. $V_{AG}$ is an analog ground voltage that is nominally halfway between the more-positive and ground.

Bandpass filter 840 includes a variable capacitor 850, and a differential inductor 860. Variable capacitor 850 includes two fixed capacitors 851 and 852, two binary-coded capacitors 853 and 844, and two thermometer-coded capacitors 855 and 856. Capacitor 851 has a first terminal connected to the first output terminal of amplifier 850, and a second terminal connected to ground. Capacitor 852 has a first terminal connected to ground, and a second terminal connected to the second output terminal of amplifier 830. Capacitor 853 has a first terminal connected to the first output terminal of amplifier 830, a second terminal connected to ground, and a tuning input terminal for receiving a binary-coded tuning signal. Capacitor 854 has a first terminal connected to ground, a second terminal connected to the second output terminal of amplifier 830, and a tuning input terminal for receiving the binary-coded tuning signal. Capacitor 855 has a first terminal connected to the first output terminal of amplifier 830, a second terminal connected to ground, and a tuning input terminal for receiving a thermometer-coded tuning signal. Capacitor 856 has a first terminal connected to ground, a second terminal connected to the second output terminal of amplifier 830, and a tuning input terminal for receiving a thermometer-coded tuning signal.

Differential inductor 860 includes inductors 862 and 864. Inductor 862 has a first terminal connected to the first output terminal of amplifier 830, and a second terminal connected to $V_{AG}$. Inductor 864 has a first terminal connected to $V_{AG}$, and a second terminal connected to the second output terminal of amplifier 830.

In operation, filter 732 operates as a band filter and single-ended to differential converter for the amplified $RF_{IN}$ signal when the user selects a channel in the $VHF_{LO}$ band from 50 MHz to 190 MHz. However instead of merely providing a variable cutoff frequency within this band, lowpass filter 732 provides some selectivity in a narrower frequency band centered around the desired channel. Thus lowpass filter 732 provides some of the benefit of a bandpass filter without requiring high-quality (and thus large) on-chip inductors. At the same time, filter 732 significantly attenuates higher frequency components which helps maintain good signal-to-noise ratio that might otherwise cause parasitic mixing of unwanted energy into the passband.

The resonant frequency of filter 800 ("$f_R$") is given by:

$$f_R = \frac{1}{2\pi}\sqrt{\left(\frac{1}{LC}\right) \cdot \sqrt{1 + \frac{2R^2C}{L}} - \left(\frac{R}{L}\right)^2} \quad (13)$$

in which L represents the inductance of inductor 824, C represents the capacitance of variable capacitor 810, and R represents the resistance of resistor 822. The 3 dB bandwidth around $f_R$ ("BW") is given by:

$$BW = \frac{1}{2\pi} \cdot \frac{R}{L} \quad (14)$$

TABLE I below shows the values of the various components used in RLC filter 800 for the $VHF_{LO}$ filter band:

TABLE I

| Element | Value |
| --- | --- |
| Fixed capacitor 812 | 1.63 pF |
| Binary coded capacitor 814 | 15 × 9.4 fF |
| Thermometer coded capacitor 816 | 31 × 150 fF |
| Resistor 822 | 396 Ω |
| Inductor 824 | 465 nH | in which pF represents picoFarads, fF represents femtoFarads, Ω represents ohms, and nH represents nanoHenrys. Note that the 396Ω resistance of resistor 822 is formed by 345Ω of parasitic resistance of inductor 824 along with a separate 54Ω resistor.

TABLE II below shows the values of the various components in bandpass filter 840 used for the $VHF_{LO}$ filter band:

TABLE II

| Element | Value |
| --- | --- |
| Fixed capacitors 851 and 852 | 10 pF |
| Binary coded capacitors 853 and 854 | 15 × 150 fF |
| Thermometer coded capacitors 855 and 856 | 31 × 2.4 pF |
| Parasitic resistance of inductors 862 and 864 | 28 Ω |
| Inductors 862 and 864 | 86 nH |

Using a currently available 0.55 micron CMOS manufacturing process with copper metallization and eight available metal layers, in $VHF_{LO}$ filter 732, inductor 824 can be formed in a die surface area of 150 microns (μm)×150 μm, and inductor 860 in a die surface area of 280 μm×160 μm. However as noted above the inductor in the $VHF_{LO}$ bandpass filter of receiver 200 of FIG. 2 requires a die surface area of approximately 600 μm×600 μm. Thus the lower-Q inductors used in $VHF_{LO}$ filter 732 require only about 19% of the die surface area of the higher-Q inductor required for the $VHF_{LO}$ bandpass filter of FIG. 2. Filter 732 actually takes advantage of the parasitic resistance in inductor 824 to reduce the size of the other components for a given $f_R$. Thus filter 732 achieves most of the benefit of a parallel resonant bandpass filter but with significantly reduced die area and helps receiver 700 achieve low cost.

Figure 9:
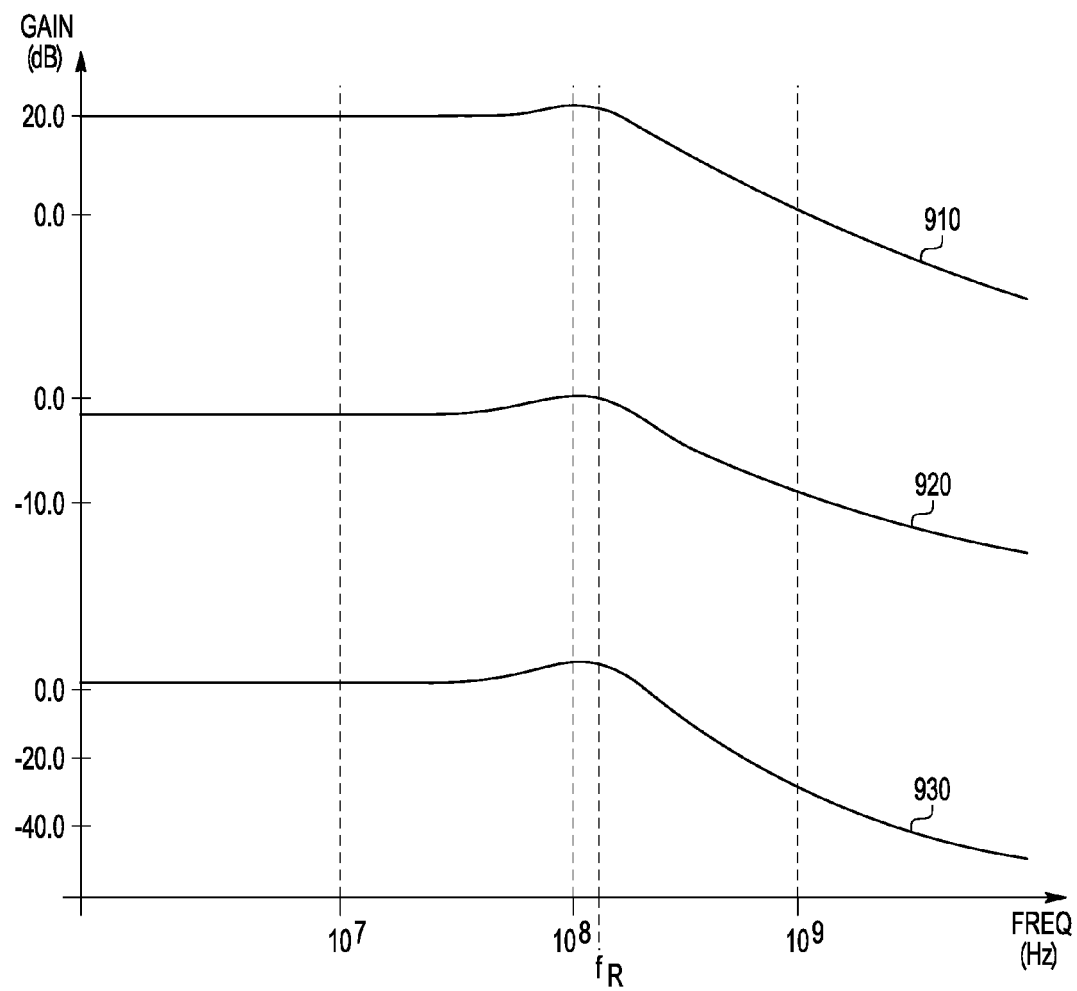
FIG. 9 illustrates a frequency domain graph useful in understanding the operation of the $VHF_{LO}$ filter of FIG. 7.

FIG. 9 illustrates a frequency domain graph useful in understanding the operation of the $VHF_{LO}$ filter of FIG. 7. In FIG. 9, the vertical axis represents gain in decibels (dB), whereas the horizontal axis represents frequency on a logarithmic scale in Hz. A first waveform 910 corresponds to the frequency response of RLC filter 800 and is relatively flat but with a small dip of about 2-3 dB below $f_R$, exhibits a relatively constant dropoff with increasing frequency for frequencies above $f_R$, and has a peak at resonant frequency $f_R$. The peak is small for $f_R$ near the low end of the $VHF_{LO}$ band, but increases to about 6 dB for $f_R$ at the high end of the $VHF_{LO}$ band (the case illustrated in FIG. 9).

A second waveform 920 corresponds to the frequency response of bandpass filter 840, and is substantially flat for lower frequencies below $f_R$, exhibits a relatively constant dropoff with increasing frequency for frequencies above $f_R$, and has a peak of about 4-6 dB at resonant frequency $f_R$. The peak is around 4 dB for $f_R$ near the low end of the $VHF_{LO}$ band, and increases to about 6 dB for $f_R$ at the high end of the $VHF_{LO}$ band.

A third waveform 930 corresponds to the overall frequency response to $VHF_{LO}$ filter 732, and is relatively flat with a small dip for frequencies below $f_R$, exhibits a relatively constant dropoff with increasing frequency for frequencies above $f_R$, and has a peak of 4-10 dB at resonant frequency $f_R$. The peak is around 4 dB for $f_R$ near the low end of the $VHF_{LO}$ band, and increases to about 10 dB for $f_R$ at the high end of the $VHF_{LO}$ band. Thus the addition of bandpass filter 840 ensures some selectivity for frequencies near $f_R$ for frequencies at the low end of the $VHF_{LO}$ band.

Thus receiver 700 is highly integrated and achieves low cost by using on-chip inductors. The size of the inductor in the $VHF_{LO}$ band can be made small by implementing a single-ended filter as an RLC filter in which the resistance is formed in part by the parasitic resistance of an on-chip inductor, and in part by a separate integrated resistor. Receiver 700 adds an additional parallel resonant LC filter bandpass with a slightly higher quality inductor to provide additional selectivity in the passband.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A receiver comprising:
   a first amplifier having an input for receiving a radio frequency (RF) signal, and an output for providing an amplified RF signal;
   a switch section for selectively switching the RF signal onto a selected one of a plurality of nodes; and
   a filter section comprising a plurality of filters coupled to respective ones of the plurality of nodes,
   wherein a first filter of the plurality of filters comprises a first variable capacitor coupled in parallel with an inductance leg between a corresponding one of the plurality of nodes and a power supply voltage terminal, wherein the first variable capacitor has a capacitance that varies in response to a tuning signal, and the inductance leg comprises a first inductor in series with an effective resistance, wherein the effective resistance has a value related to an upper cutoff frequency to be tuned by the first filter.

2. The receiver of claim 1, further comprising:
   a resistor having a first terminal coupled to the output of the first amplifier, and a second terminal coupled to a first terminal of the inductor, wherein the effective resistance of the inductance leg is equal to a resistance of the resistor plus a parasitic resistance of the inductor.

3. The receiver of claim 1, wherein the first variable capacitor comprises:
   a fixed capacitor having a first terminal coupled to the output of the first amplifier, and a second terminal coupled to the power supply voltage terminal;
   a binary capacitor having a first terminal coupled to the output of the first amplifier, a second terminal coupled to the power supply voltage terminal, and a control terminal for receiving a binary coded signal; and
   a thermometer capacitor having a first terminal coupled to the output of the first amplifier, a second terminal coupled to the power supply voltage terminal, and a control terminal for receiving a thermometer coded signal.

4. The receiver of claim 1, further comprising:
   a second amplifier having an input coupled to the output of the first amplifier, and first and second outputs forming a differential signal pair;
   a second variable capacitor having a first terminal coupled to the first output of the second amplifier, and a second terminal coupled to the second output of the second amplifier, and a tuning input terminal; and
   a second inductor having a first terminal having a first terminal coupled to the first output of the second amplifier, and a second terminal coupled to the second output of the second amplifier.

5. The receiver of claim 1, wherein the plurality of filters comprises:
   a second filter having an input selectively coupled to the output of the first amplifier through the switch section for attenuating components of the output of the first amplifier below the upper cutoff frequency of the first filter and above an upper cutoff frequency of the second filter; and
   a third filter having an input selectively coupled to the output of the first amplifier through the switch section for attenuating components of the output of the first amplifier below the upper cutoff frequency of the second filter.

6. The receiver of claim 5, wherein the upper cutoff frequency of the first filter is approximately equal to 190 megahertz (MHz).

7. The receiver of claim 6, wherein the third filter comprises:
   a third variable capacitor including a first terminal coupled to the output of the first amplifier, and a second terminal coupled to a second power supply voltage terminal; and
   a transformer including a primary winding having a first terminal coupled to the first terminal of the third variable capacitor and a second terminal coupled to a third power supply voltage terminal, and a secondary winding having a first terminal and a second terminal for providing a differential filtered radio frequency signal thereto.

8. The receiver of claim 7, wherein the upper cutoff frequency of the second filter is approximately equal to 470 MHz.

9. The receiver of claim 1, wherein the RF signal comprises a television signal.

10. The receiver of claim 9, wherein the switch section selectively switches the RF signal onto a selected one of the plurality of nodes in response to a desired channel.

11. A method comprising:
receiving a radio frequency (RF) input signal;
amplifying the RF input signal to form an amplified RF input signal;
selectively switching the amplified RF input signal to one of a plurality of nodes;
filtering the amplified RF signal using a selected one of a plurality of filters coupled to respective ones of the plurality of nodes; and
in response to switching the amplified RF signal onto a first of the plurality of nodes, filtering the amplified RF input signal using a first filter of the plurality of filters, wherein the first filter comprises a first variable capacitor coupled in parallel with an inductance leg between a corresponding one of the plurality of nodes and a power supply voltage terminal, wherein the first variable capacitor has a capacitance that varies in response to a tuning signal, and the inductance leg comprising a first inductor in series with an effective resistance, wherein the effective resistance has a value related to an upper cutoff frequency to be tuned by the first filter.

12. The method of claim 11, further comprising selectively switching the amplified RF input signal to one of the plurality of nodes corresponding to a desired frequency band.

13. The method of claim 12 further comprising:
selectively switching the amplified RF signal onto a second node coupled to a second filter, wherein the second filter attenuates components of the amplified RF signal below the upper cutoff frequency of the first filter and above an upper cutoff frequency of the second filter; and
selectively switching the amplified RF signal onto a third node coupled to a third filter, wherein the third filter attenuates components of the amplified RF signal below the upper cutoff frequency of the second filter.

14. The method of claim 13, wherein receiving the RF signal further comprises receiving a television signal.

15. The method of claim 14, wherein selectively switching the amplified RF input signal to one of the plurality of nodes comprises selectively switching the amplified RF input signal to one of the plurality of nodes in response to a desired channel.

16. The method of claim 11, further comprising:
forming the effective resistance by coupling a resistor in series with the first inductor, wherein the effective resistance of the inductance leg is equal to a resistance of the resistor plus a parasitic resistance of the inductor.

17. The method of claim 11, further comprising forming the first variable capacitor with a parallel combination of:
a fixed capacitor;
a binary capacitor having a control terminal for receiving a binary coded signal; and
a thermometer capacitor having a control terminal for receiving a thermometer coded signal.

18. The method of claim 11, wherein filtering the amplified RF input signal using the first filter of the plurality of filters further comprises:
further amplifying the amplified signal; and
further filtering the further amplified signal using a second variable capacitor in parallel with a second inductor.

19. The method of claim 18, further comprising forming the second variable capacitor with a parallel combination of:
a fixed capacitor;
a binary capacitor having a control terminal for receiving a binary coded signal; and
a thermometer capacitor having a control terminal for receiving a thermometer coded signal.

20. The method of claim 18, wherein:
the further amplifying the amplified signal comprises further amplifying the amplified signal to provide the further amplified signal as a differential signal; and
the further filtering comprises differentially filtering the differential signal using the second variable capacitor in parallel with the second inductor.

* * * * *